United States Patent
Kim et al.

(10) Patent No.: US 8,071,484 B2
(45) Date of Patent: Dec. 6, 2011

(54) METHOD OF FORMING FINE PATTERN EMPLOYING SELF-ALIGNED DOUBLE PATTERNING

(75) Inventors: Kyoung-Mi Kim, Gyeonggi-do (KR); Jae-Ho Kim, Gyeonggi-do (KR); Young-Ho Kim, Gyeonggi-do (KR); Myung-Sun Kim, Seoul (KR); Youn-Kyung Wang, Gyeonggi-do (KR); Mi-Ra Park, Gyeongsangnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 840 days.

(21) Appl. No.: 12/132,548

(22) Filed: Jun. 3, 2008

(65) Prior Publication Data
US 2008/0305636 A1    Dec. 11, 2008

(30) Foreign Application Priority Data
Jun. 7, 2007    (KR) .................. 10-2007-0055456

(51) Int. Cl.
*H01L 21/311*    (2006.01)
*B44C 1/22*    (2006.01)
(52) U.S. Cl. .............. 438/717; 216/13; 216/41; 216/47; 438/694; 438/696; 430/312
(58) Field of Classification Search .............. 216/13, 216/41, 47; 438/717, 694, 696; 430/312
See application file for complete search history.

(56) References Cited

U.S. PATENT DOCUMENTS

| | | | |
|---|---|---|---|
| 5,686,223 A | 11/1997 | Cleeves | |
| 6,319,853 B1 * | 11/2001 | Ishibashi et al. | 438/780 |
| 6,833,326 B2 * | 12/2004 | Koh et al. | 438/725 |
| 7,855,154 B2 * | 12/2010 | Li et al. | 438/787 |
| 2006/0079628 A1 * | 4/2006 | Sugeta et al. | 524/503 |
| 2006/0160028 A1 * | 7/2006 | Lee et al. | 430/312 |

FOREIGN PATENT DOCUMENTS

| | | |
|---|---|---|
| JP | 10-073927 | 3/1998 |
| JP | 2006-261307 | 9/2006 |
| KR | 10-0574999 | * 4/2006 |
| KR | 10-2006-0100251 | 9/2006 |
| KR | 10-2006-0110097 | 10/2006 |
| KR | 10-2006-0110706 | 10/2006 |
| KR | 10-2006-0134234 | 12/2006 |

* cited by examiner

*Primary Examiner* — Shamim Ahmed
(74) *Attorney, Agent, or Firm* — Volentine & Whitt, PLLC

(57) ABSTRACT

There are provided a method of forming a fine pattern employing self-aligned double patterning. The method includes providing a substrate. First mask patterns are formed on the substrate. A reactive layer is formed on the substrate having the first mask patterns. The reactive layer adjacent to the first mask patterns is reacted using a chemical attachment process, thereby forming sacrificial layers along outer walls of the first mask patterns. The reactive layer that is not reacted is removed to expose the sacrificial layers. Second mask patterns are formed between the sacrificial layers adjacent to sidewalls of the first mask patterns facing each other. The sacrificial layers are removed to expose the first and second mask patterns and the substrate exposed between the first and second mask patterns. The substrate is etched using the first and second mask patterns as an etching mask.

20 Claims, 8 Drawing Sheets

METHOD OF FORMING FINE PATTERN EMPLOYING SELF-ALIGNED DOUBLE PATTERNING

CROSS-REFERENCE TO RELATED APPLICATION

This application claims priority from Korean Patent Application No. 2007-0055456, filed Jun. 7, 2007, the disclosure of which is hereby incorporated herein by reference in its entirety as if set forth fully herein.

BACKGROUND

1. Technical Field

The present invention relates to a method of forming a fine pattern, and particularly, to a method of forming a fine pattern employing self-aligned double patterning.

2. Discussion of the Related Art

As the integration density of semiconductor devices increases, technology for integrating many devices in a narrow area is required. In order to integrate a plurality of devices in a narrow area, it is required to reduce the size of a device formed on a semiconductor substrate.

The high integration of a semiconductor is closely related to a photolithography process in processes of fabricating the semiconductor device. Specifically, the minimum size of a pattern formed through the photolithography process is determined by limiting resolution of an exposure apparatus. The resolution of such an exposure apparatus is determined depending on the wavelength of a light source. That is, as the wavelength of the light source is shorter, the resolution of the exposure apparatus is more increased. Accordingly, a light source having a short wavelength has been continuously developed to increase the resolution. For example, a photo process has been developed by sequentially using a G-line laser having a wavelength of 436 nm, a I-line laser having a wavelength of 365 nm, a KrF laser having a wavelength of 248 nm, an ArF laser having a wavelength of 193 nm and an $F_2$ laser having a wavelength of 157 nm as light sources. In addition, a process of using an X-ray or electron beam as a light source has been developed. As such, it is necessary to develop a light source in accordance with the short wavelength of the light source and develop a photoresist corresponding to the light source. However, a great deal of development cost is required in the development of a new light source and a photoresist corresponding to the light source.

Therefore, studies and research have been conducted to provide methods of forming fine patterns having a narrower width than the limiting resolution of an exposure apparatus used in a conventional process by using the exposure apparatus as it is. A method of forming the fine pattern has been disclosed in U.S. Pat. No. 5,686,223, entitled "Method for reduced pitch lithography" by Cleeves. According to Cleeves, a photolithography process is performed twice to form first and second photoresist patterns. Specifically, first photoresist patterns are formed on a substrate by performing a first photolithography process. After stabilizing the first photoresist patterns, second photoresist patterns are formed between the first photoresist patterns on the substrate. As such, the photoresist patterns formed through the two photolithography processes have a reduced pitch. However, as the integration density of semiconductor devices becomes higher, a pitch is more reduced. As a result, when forming the second photoresist pattern formed through the second photolithography process, the second photoresist patterns may not be precisely formed at a desired position due to misalignment.

SUMMARY

Therefore, the technology is directed to provide a method of forming a fine pattern, which can form a fine pattern having a narrower width than limiting resolution.

In accordance with an exemplary embodiment, the technology provides a method of forming a fine pattern. The method can comprise providing a substrate. A first mask pattern can be formed on the substrate. A reactive layer can be formed on the substrate having the first mask pattern. The reactive layer can be reacted adjacent to the first mask pattern, employing a chemical attachment process, thereby forming sacrificial layers along outer walls of the first mask pattern. Providing that a portion of the reactive layer is unreacted after completion of the chemical attachment process, the unreacted portion can be removed to expose the sacrificial layers. A second mask pattern can be formed between the sacrificial layers adjacent to the sidewalls of the first mask pattern which are facing each other. Then, the sacrificial layers can be removed to expose the first and second mask pattern. Thereafter, the substrate can be etched using the first and second mask pattern as an etching mask. In an embodiment, the chemical attachment process can comprise a crosslinking reaction performed at a boundary region between the reactive layer and the first mask pattern, and a crosslinking reaction performed in the reactive layer adjacent to the boundary region.

In another embodiment, the reactive layer can comprise a material layer having an etch selectivity with respect to the first and second mask pattern. In a further embodiment, the reactive layer can contain a silicon oxide polymer having the following Chemical Formula 1:

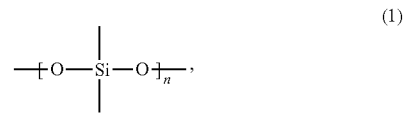

(1)

wherein n denotes a positive number from 1 to 5000. In still a further embodiment, forming of the reactive layer can comprise forming the silicon oxide polymer on the substrate using a spin coating process. In still another embodiment, the silicon oxide polymer can comprise at least one of alkoxy and methoxy groups. In yet another embodiment, the reactive layer that is unreacted can be removed using a tetramethyl ammonium hydroxide (TMAH) solution. In a further embodiment herein, the reactive layer can further comprises a crosslinker. Moreover, the reactive layer further can further comprise a surfactant.

In one embodiment, the first and second mask pattern can comprise one of poly-silicon layers and silicon nitride layers. In another embodiment, the crosslinker can comprise a material having the following Chemical Formula 2:

(2)

wherein R denotes an alkyl group, and n denotes a positive number of about 1 to 5000.

An embodiment can also provide that the forming of the sacrificial layers which can comprise heating the reactive layer using a heating process, the heating process being performed through a rear surface of the substrate. In a further embodiment, the heating process can be performed at a temperature in a range from about 100° C. to 120° C. for about 60 to 90 seconds.

In an embodiment herein, before forming the reactive layer, a reaction promoting layer can be formed along outer surfaces of the first mask pattern and the substrate exposed between the first mask pattern on the substrate having the first mask pattern. In another embodiment, the sacrificial layers can be formed to extend up to the substrate between the first mask pattern. In a further embodiment, the reaction promoting layer can comprise a material layer comprising hexamethyldisilazane (HMDS).

In one embodiment, before forming the first mask pattern, a buffer mask layer can be formed on the substrate. In a further embodiment, providing of the substrate can comprise preparing a semiconductor substrate, and forming one layer selected from at least one of a conductive layer, an insulating layer, and a combination layer thereof, on the semiconductor substrate. Moreover, in another embodiment, forming of the second mask pattern can comprise forming a mask layer on the substrate having the sacrificial layer, and planarizing the mask layer such that the mask layer remains between the sacrificial layers. In still another embodiment, the first and second mask pattern can be formed having top surfaces at the same level. In still a further embodiment, a distance between opposite sidewalls of the sacrificial layers between the neighboring first mask pattern can be substantially the same as the width of the first mask pattern.

BRIEF DESCRIPTION OF THE DRAWINGS

The above and other features and advantages of the technology will become more apparent to those of ordinary skill in the art by describing in detail preferred embodiments thereof with reference to the attached drawings in which.

DETAILED DESCRIPTION

Figure 1A:
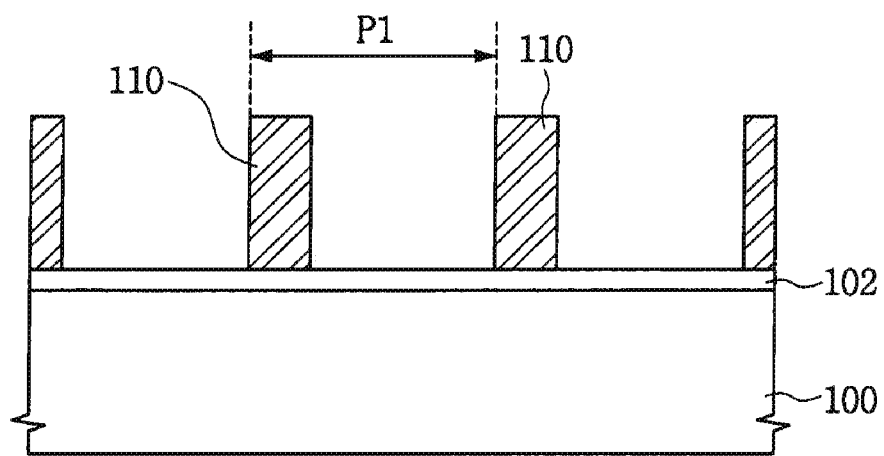
FIGS. 1A through 1H are cross-sectional views illustrating a method of forming a fine pattern according to an embodiment of the technology.

The technology will now be described more fully hereinafter with reference to the accompanying drawings, in which preferred embodiments are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

FIGS. 1A through 1H are cross-sectional views illustrating a method of forming a fine pattern according to an embodiment of the technology.

Referring to FIG. 1A, a pad layer 102 is formed on a substrate 100. The substrate 100 includes a semiconductor substrate such as a silicon wafer or silicon on insulator (SOI) wafer. Structures such as an isolation layer, transistors and/or an interlayer dielectric layer can be additionally formed in the substrate 100. The structures can be combined to form volatile memory devices or nonvolatile memory devices. However, descriptions of the structures will be omitted for brief description. The pad layer 102 includes at least one of a thermal oxidation layer and a silicon nitride layer.

Continuously, a first mask layer is formed on a surface of the pad layer 102. The first mask layer includes a material layer having an etch selectivity with respect to the substrate 100, in one embodiment, a silicon nitride layer. Photoresist patterns are formed on the first mask layer using a photolithography process such that they are spaced apart from one another at a predetermined distance. As viewed on a plan view, the photoresist patterns can be formed in a line type, a hole type and/or a combination type thereof. Subsequently, the first mask layer is etched using the photoresist patterns as an etching mask, thereby forming first mask patterns 110 spaced apart from one another at a predetermined distance. In this case, a distance between the first mask patterns 110 spaced apart from one another, i.e., a first pitch size P1, can be substantially identical to limiting resolution of the photolithography process.

Figure 1B:
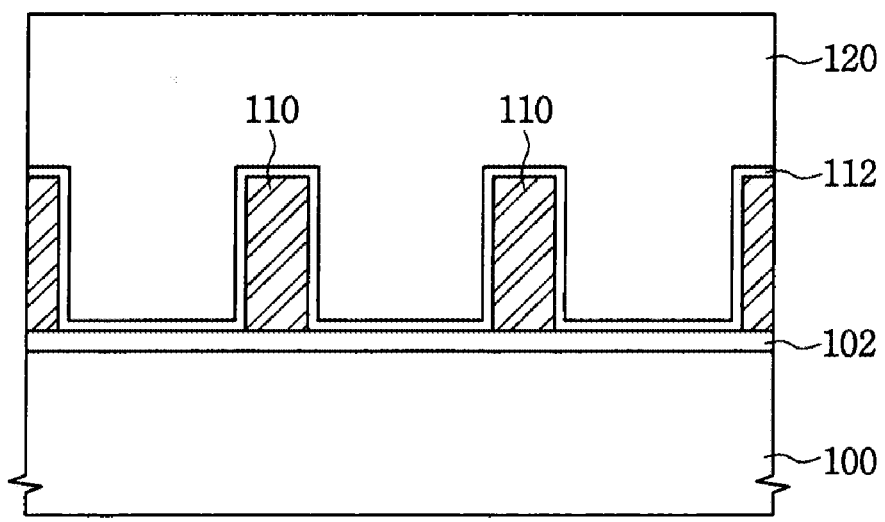

Referring to FIG. 1B, a reaction promoting layer 112 is formed on the substrate 100 having the first mask patterns 110. The reaction promoting layer 112 is formed to cover the substrate 100 and sidewalls and top surfaces of the first mask patterns 110. The reaction promoting layer 112 can include a material layer containing hexamethyldisilazane (HMDS). The HMDS-containing layer can be formed by supplying HMDS gas on the substrate 100.

Subsequently, a reactive layer 120 is formed on the surface of the substrate 100 having the reaction promoting layer 112. The reactive layer 120 can include a polymer, a crosslinker and a surfactant, used in a crosslinking reaction. The reactive layer 120 can be formed using a spin coating process. The polymer is a material layer having an etch selectivity with respect to the first mask patterns 110. The polymer can comprise a silicon oxide polymer having the following Chemical Formula 1:

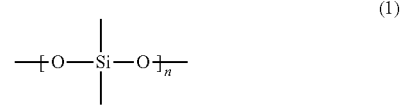

(1)

Here, n denotes a positive number from 1 to 5000.

At least one group comprising alkoxy and methoxy groups can be further included in the link site of the silicon oxide polymer. Therefore, the crosslinking reaction can be more actively produced.

The crosslinker is interposed between the polymers to effectively produce the crosslinking reaction of the polymers. The crosslinker can comprise a material having the following Chemical Formula 2:

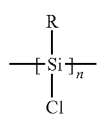

(2)

Here, R denotes an alkyl group, and n denotes a positive number from 1 to 5000.

The surfactant can improve gapfill and coating properties of the silicon oxide polymer. A nonionic surfactant can be used as the surfactant.

In an embodiment, the reactive layer 120 including the silicon oxide polymer can be formed on the substrate 100 using the spin coating process. Gaps are formed between the first mask patterns 110.

Figure 1C:
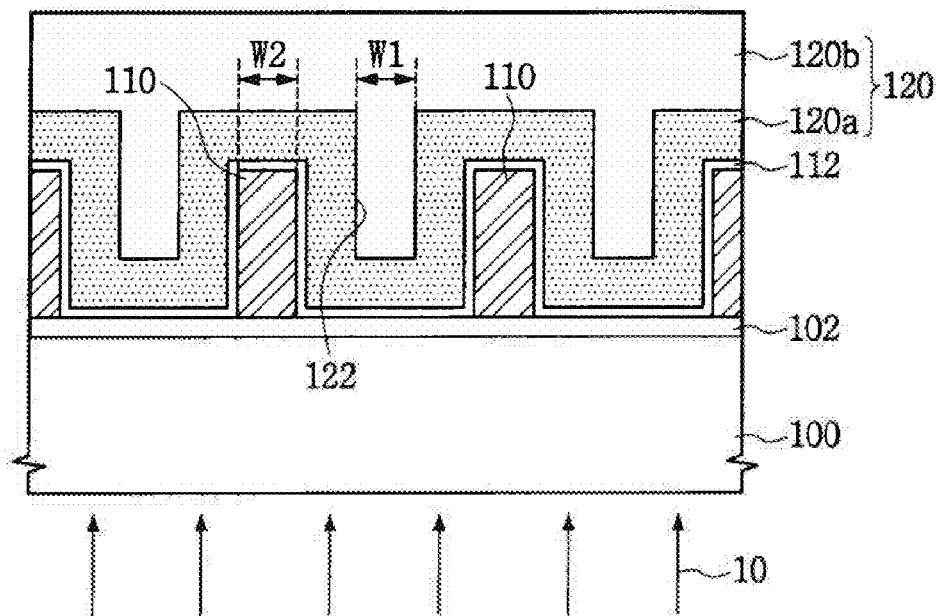

Referring to FIG. 1C, a sacrificial layer 120a is formed along outer walls of the first mask patterns 110 and the substrate 100. The layer 120a can be exposed between the first mask patterns 110 on the reaction promoting layer 112 using a chemical attachment process. In addition, a region in which the chemical attachment process is not performed in the reactive layer 120 remains as a non-reactive layer 120b.

The chemical attachment process can be performed employing a heating process 10 with respect to the substrate 100. The heating process 10 is performed through a rear surface of the substrate 100. Through the heating process 10, the chemical attachment process can be performed while accompanying a crosslinking reaction performed at a boundary region between the reactive layer 120 and the reaction promoting layer 112 and a crosslinking reaction performed in the reactive layer 120 adjacent to the boundary region. In an embodiment, when the first mask patterns 110 are formed of a silicon nitride layer, the silicon nitride layer can have a small number of link sites capable of performing the crosslinking reaction. On the other hand, if an HDMS layer is employed, since the HDMS layer used as the reaction promoting layer 112 has the plurality of link sites, the crosslinking reaction of the HDMS layer can be easily performed with the reactive layer 120. In addition, the crosslinking reaction in the silicon oxide polymers can also be produced in the reactive layer 120 adjacent to the first mask patterns 110.

Meanwhile, the sacrificial layer 120a is formed to have a uniform thickness on a surface of the reaction promoting layer 112 by adjusting the time and temperature of the heating process 10. In this case, the sacrificial layer 120a formed between sidewalls of the first mask patterns 110 facing each other is formed having grooves 122. The grooves 122 are formed having a predetermined width under the control of the heating process 10. Here, the grooves 122 are formed to have a width $W_1$ substantially identical to the width $W_2$ of the first mask patterns 110. For example, the heating process 10 is performed at a temperature of about 100° C. to 120° C. for about 60 seconds to 90 seconds.

Figure 1D:
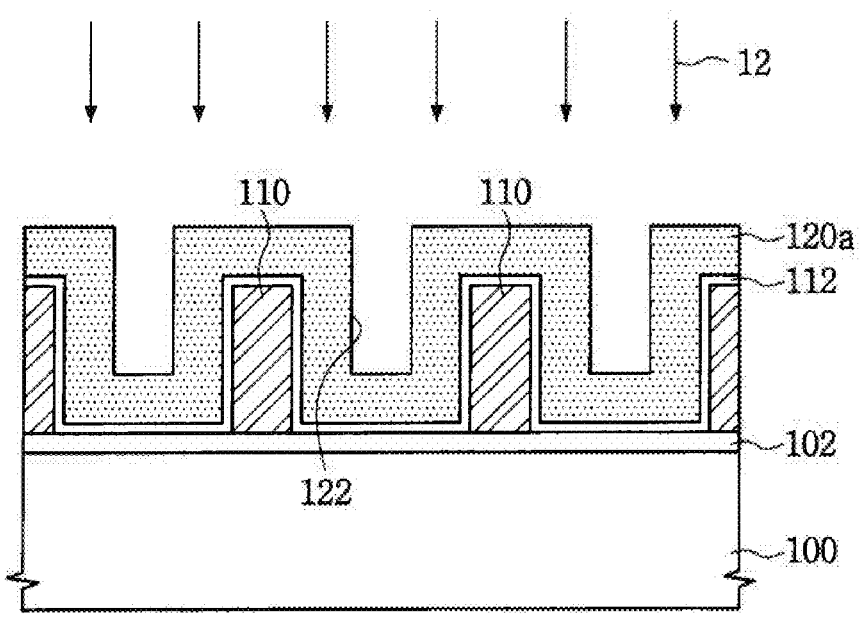

Referring to FIG. 1D, the sacrificial layer 120a is exposed by removing the non-reactive layer 120b. The removal of the non-reactive layer 120b can be accomplished by way of a removal process using a tetramethyl ammonium hydroxide (TMAH) solution 12, or the like. Silicon oxide polymers contained in the non-reactive layer 120b are dissolved by the TMAH solution 12. On the contrary, the sacrificial layer 120a, in which the silicon oxide polymers are crosslinked with one another, is not dissolved by the TMAH solution 12. That is, in the reactive layer 120, the non-reactive layer 120b is selectively dissolved in the TMAH solution 12. Accordingly, the non-reactive layer 120b is completely removed at boundaries of the grooves 122, so that the grooves 122 can be exposed which have a substantially uniform width.

Figure 1E:
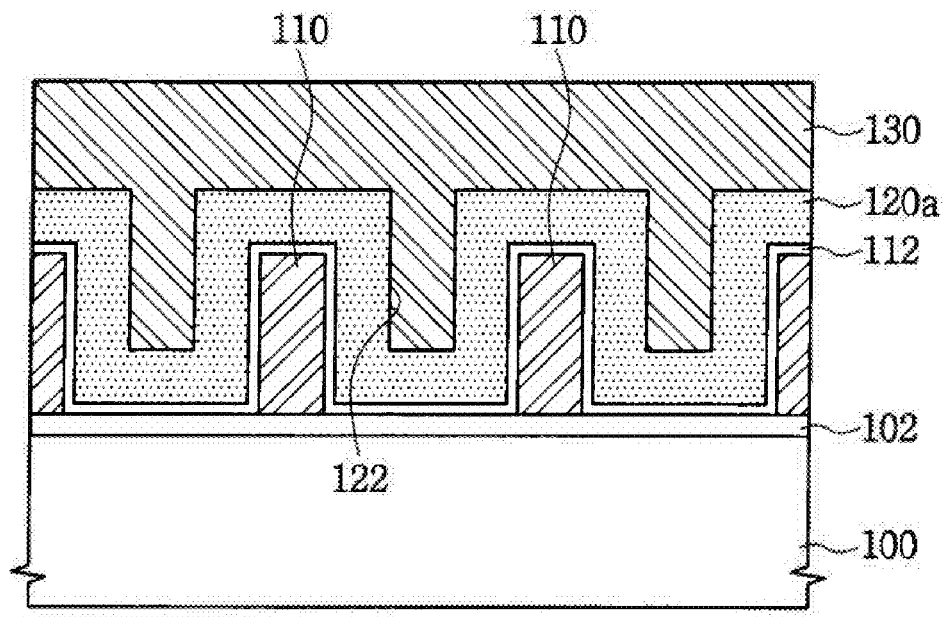

Referring to FIG. 1E, a second mask layer 130 is formed on the substrate 100 having the sacrificial layer 120a. The second mask layer 130 includes a material layer having an etch selectivity with respect to the substrate 100 and the sacrificial layer 120a. The second mask layer 130 can comprise the same material layer as the first mask patterns 110.

Figure 1F:
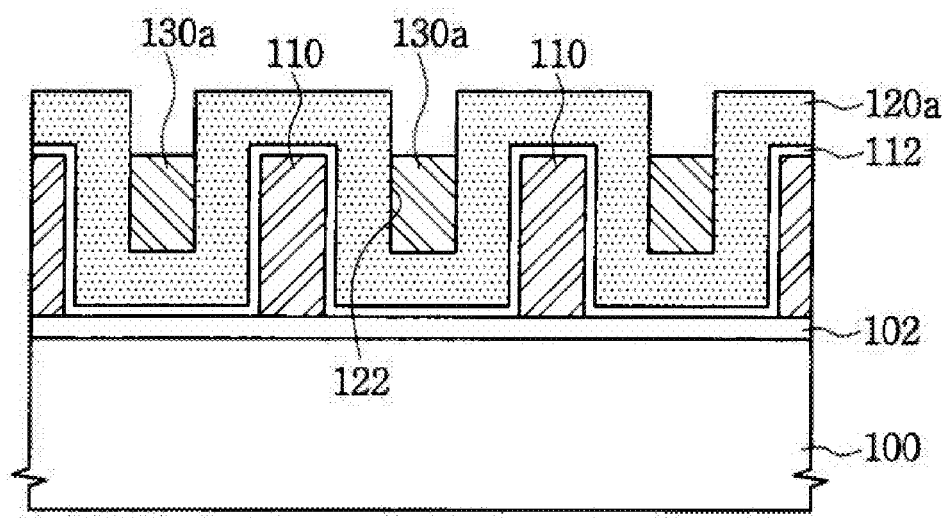

Referring to FIG. 1F, the second mask layer 130 is planarized such that it remains in the grooves 122. As a result, second mask patterns 130a are formed to fill the grooves 122.

The planarization process can be performed using an etchback or chemical mechanical polishing (CMP) technique. The second mask patterns 130a can be formed to have a level substantially identical to top surfaces of the first mask patterns 110 using the etchback technique. In another embodiment, the second mask patterns 130a may be planarized to have a level substantially identical to a top surface of the sacrificial layer 120a, so that the second mask patterns 130 are formed to have a higher level than the first mask patterns 110. In the current embodiment, the second mask patterns 130a are self-aligned through the grooves 122. Accordingly, the first and second mask patterns 110 and 130a are formed at a uniform distance, so that a precise patterning process can be performed.

Figure 1G:
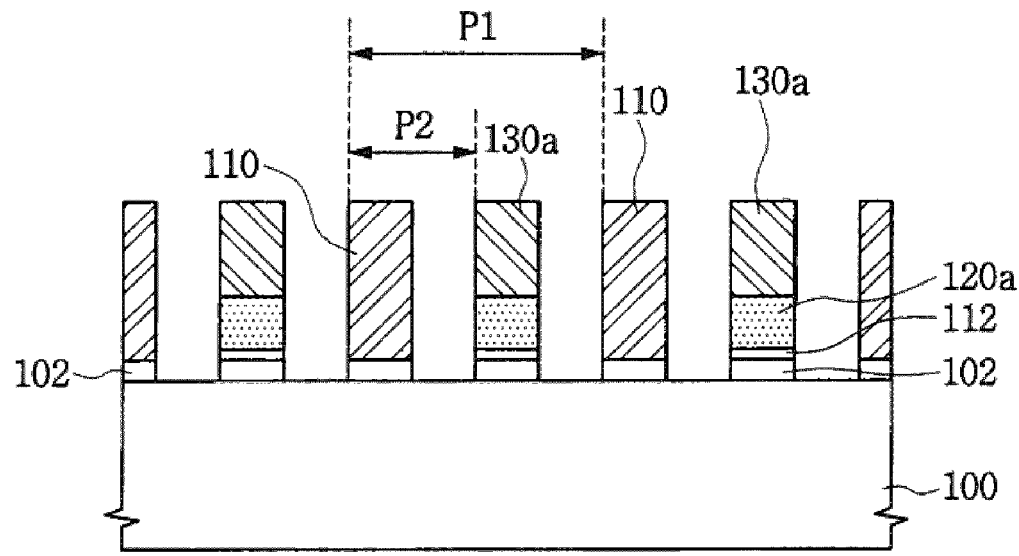

Referring to FIG. 1G, the sacrificial layer 120a, the reaction promoting layer 112 formed beneath the sacrificial layer 120a and the pad layer 102 are sequentially etched and removed, thereby exposing the first and second mask patterns 110 and 130a and the substrate 100 between the first and second mask patterns 110 and 130a. If the sacrificial layer 120a includes silicon oxide, it can be removed using an etching process employing $CF_4$ gas as an etching gas. In this case, the sacrificial layer 120a may remain beneath the second mask patterns 130a, and the pad layer 102 may remain beneath the first mask patterns 110 and the sacrificial layer 120a.

According to the aforementioned embodiment, a distance between the first and second mask patterns 110 and 130a, i.e., a second pitch size $P_2$, is smaller than the first pitch size $P_1$. Although an exposure apparatus having the first pitch size $P_1$ is provided with a light source having a wavelength relatively greater than an exposure apparatus capable of simultaneously forming the first and second mask patterns 110 and 130a, mask patterns having a smaller pitch size than the first pitch size $P_1$ can be formed through the aforementioned exposure apparatus having the first pitch size $P_1$. That is, the mask patterns can be formed to have a smaller pitch size than the resolution of the photolithography process.

Figure 1H:
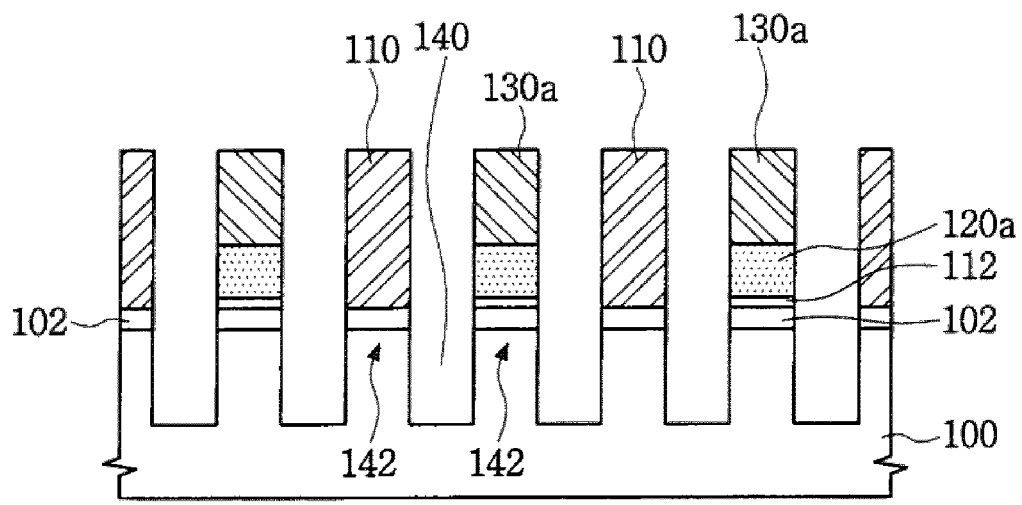

Referring to FIG. 1H, the substrate 100 is etched using the first and second mask patterns 110 and 130a as an etching mask, thereby forming trenches 140 defining active regions 142. The etching of the substrate 100 can be performed using an anisotropic etching process, an isotropic etching process, or a combination process thereof.

Hereinafter, a method of forming a fine pattern according to another embodiment of the technology will be described with reference to FIGS. 2A through 2H. FIGS. 2A through 2H are cross-sectional views illustrating a method of forming a fine pattern according to another embodiment of the technology.

Figure 2A:
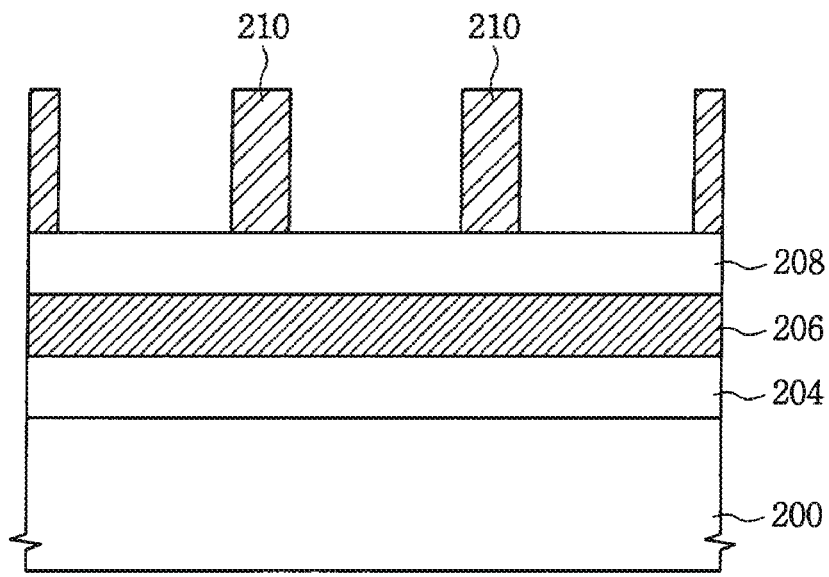
FIGS. 2A through 2H are cross-sectional views illustrating a method of forming a fine pattern according to another embodiment of the technology.

Referring to FIG. 2A, first and second layers 204 and 206 are sequentially formed on a substrate 200. The substrate 200 includes a semiconductor substrate such as a silicon wafer or SOI wafer. Structures such as a isolation layer, transistors and/or an interlayer dielectric layer can be additionally formed in the substrate 200. The structures can be combined to form volatile memory devices or nonvolatile memory devices. However, descriptions of the structures will be omitted for brief description. Hereinafter, differences between the current embodiment and the embodiment described with reference to FIGS. 1A through 1H will be described in detail.

The first layer 204 can include an insulating layer, a conductive layer, or a combination layer thereof. The second layer 206 can include a material layer different from the first layer 204. The second layer 206 can also include an insulating layer, a conductive layer, or a combination layer thereof. In the current embodiment, the first layer 204 includes an interlayer dielectric layer, and the second layer 206 includes a conductive layer. In addition, the second layer 206 includes a poly-silicon layer.

Subsequently, a buffer mask layer 208 is formed on the second layer 206. The buffer mask layer 208 is formed of a material layer having an etch selectivity with respect to the second layer 206, e.g., a silicon oxide layer.

Continuously, first mask patterns 210 spaced apart from one another at a predetermined distance are formed on the buffer mask layer 208. In this case, a distance between the first mask patterns 210 spaced apart from one another, i.e., a pitch size, can be substantially identical to resolution of the photolithography process. Meanwhile, the first mask patterns 210 include silicon nitride layers or poly-silicon layers.

Figure 2B:
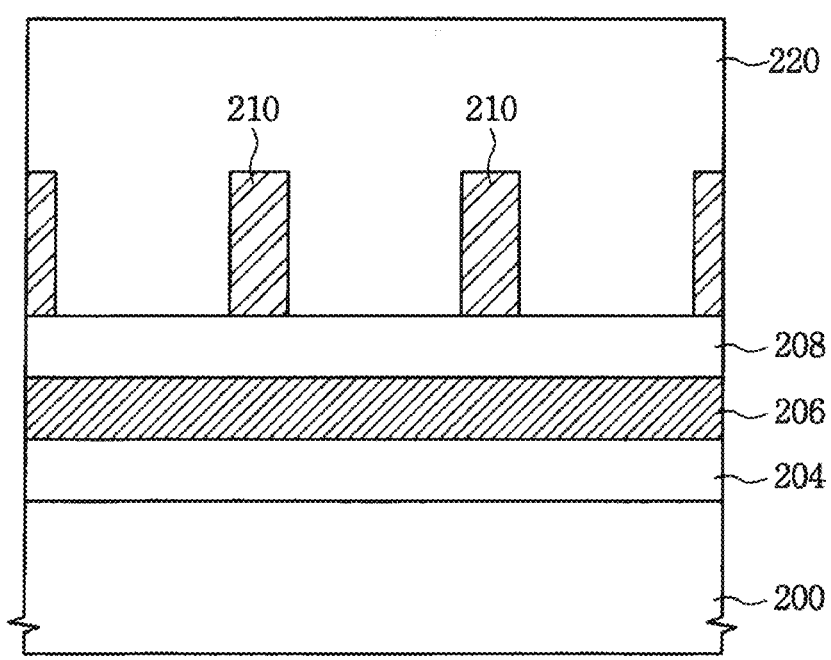

Referring to FIG. 2B, a reactive layer 220 is formed on substantially the entire surface of the substrate 200 having the first mask patterns 210. The reactive layer 220 can include a polymer, a crosslinker and a surfactant, used in a crosslinking reaction. The reactive layer 220 can be formed using a spin coating process. The polymer is a material layer having an etch selectivity with respect to the first mask patterns 210. The polymer contains a silicon oxide polymer expressed by the aforementioned Chemical Formula 1. At least one group comprising alkoxy and/or methoxy groups can be in the link site of the silicon oxide polymer.

The crosslinker is interposed between the polymers to effectively produce the crosslinking reaction of the polymers. The crosslinker can comprise a material expressed by the aforementioned Chemical Formula 2. In addition, a nonionic surfactant can be used as the surfactant.

Even though the second layer 206 can include a poly-silicon layer as described in the current embodiment, the buffer mask layer 208 including a silicon oxide layer can be formed, so that the first mask patterns 210 can include poly-silicon layers. The poly-silicon layer can have link sites more than the silicon nitride layer. Accordingly, the reaction promoting layer 112 described with reference to FIG. 1B can be omitted.

Figure 2C:
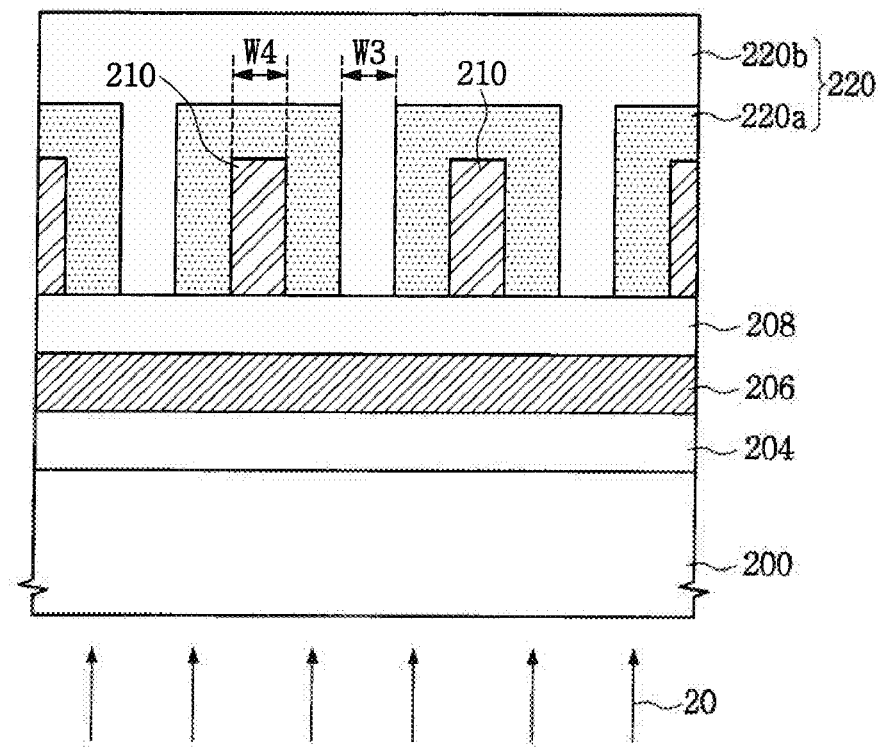

Referring to FIG. 2C, sacrificial layers 220a can be formed along outer walls of the first mask patterns 210 on the substrate 200 using a chemical attachment process. In addition, a region at which the chemical attachment process is not performed in the reactive layer 220 remains as a non-react live layer 220b.

The chemical attachment process can be performed using a heating process 20 with respect to the substrate 200, and the heating process 20 can be performed through a rear surface of the substrate 200. Through the heating process 20, the chemical attachment process can be performed while accompanying a crosslinking reaction performed at a boundary region between the reactive layer 220 and the first mask patterns 210 and a crosslinking reaction performed in the reactive layer 220 adjacent to the boundary region. For example, the crosslinking reaction of the poly-silicon layers of the first mask patterns 210 can be performed with the reactive layer 220. In addition, the crosslinking reaction between the silicon oxide polymer can also be produced in the reactive layer 220 adjacent to the first mask patterns 210. In this case, the sacrificial layers 220a may not be formed on the silicon oxide layer of the buffer mask layer 208.

Meanwhile, the sacrificial layers 220a are formed to have a substantially uniform thickness along the outer walls of the first mask patterns 210 by adjusting the time and temperature of the heating process 20. Gaps between sidewalls of the sacrificial layers 220a facing each other can be formed to have a predetermined width under the control of the heating process 20. In this case, the width $W_3$ of the gaps between the sacrificial layers 220a can be substantially identical to the width $W_4$ of the first mask patterns 210. For example, the heating process 20 is performed at a temperature of about 100° C. to 120° C. for about 60 to 90 seconds.

Figure 2D:
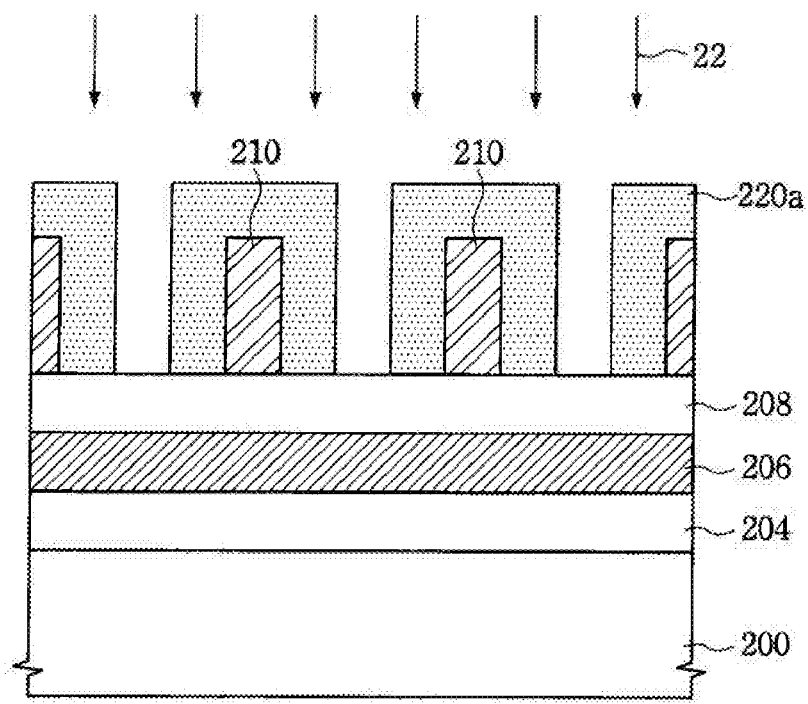

Referring to FIG. 2D, the sacrificial layers 220a are exposed by removing the non-reactive layer 220b. The removal of the non-reactive layer 220b includes a process of using a tetramethyl ammonium hydroxide (TMAH) solution 22, or the like. In the reactive layer 220, the non-reactive layer 220b is selectively dissolved in the TMAH solution 22. Accordingly, the non-reactive layer 220b between the sacrificial layers 220a is substantially completely removed, so that the sacrificial layers 220a remaining has a substantially uniform width.

Figure 2E:
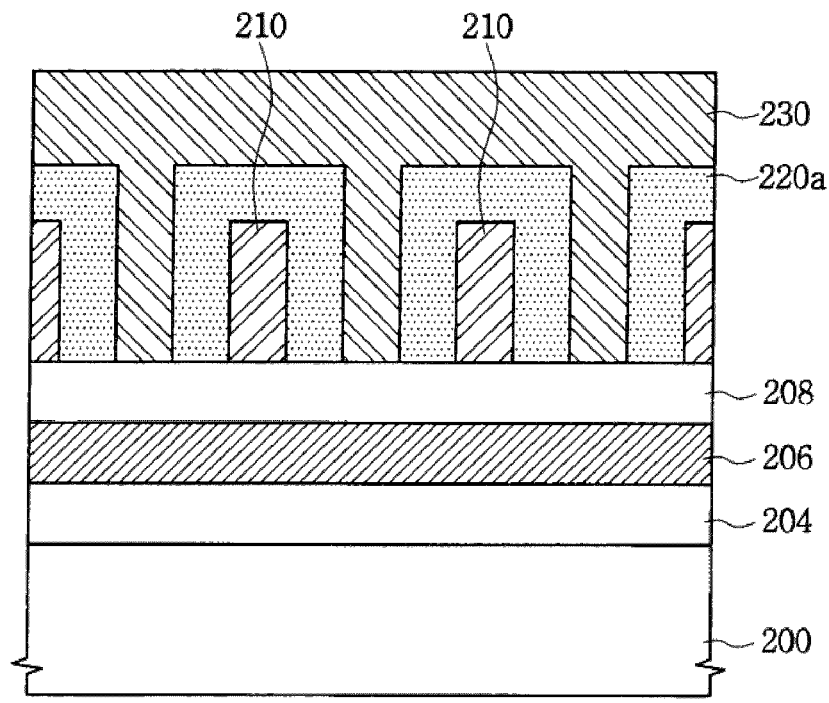

Referring to FIG. 2E, a second mask layer 230 is formed on the substrate 200 having the sacrificial layers 220a. The second mask layer 230 can include the same material layer as the first mask patterns 210.

Figure 2F:
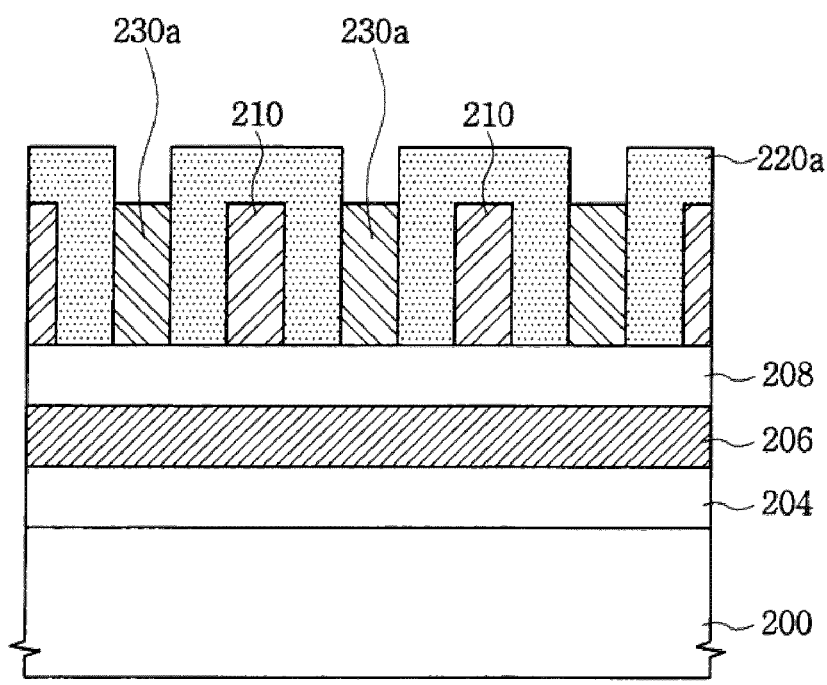

Referring to FIG. 2F, the second mask layer 230 is planarized such that it remains in the gaps between the sacrificial layers 220a. As a result, second mask patterns 230a are formed to fill the gaps.

A planarization process can be performed using an etchback or chemical mechanical polishing (CMP) technique. The second mask patterns 230a can be formed to have a level substantially identical to top surfaces of the first mask patterns 210 using the etchback technique. In the current embodiment, the second mask patterns 230a are self-aligned through the gaps.

Figure 2G:
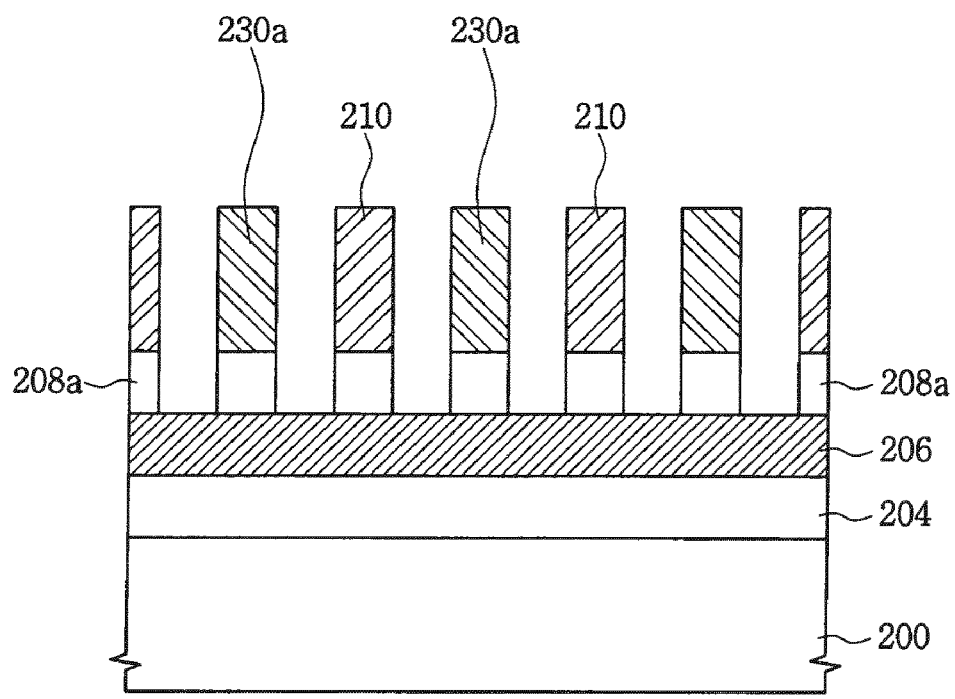

Referring to FIG. 2G, the sacrificial layers 220a and the buffer mask layer 208 between the first and second mask patterns 210 and 230a are sequentially etched and removed, thereby exposing the first and second mask patterns 210 and 230a and the substrate 200 between the first and second mask patterns 210 and 230a. If the sacrificial layers 220a include silicon oxides, they can be removed using an etching process employing $CF_4$ gas as an etching gas. In this case, buffer mask patterns 208a may remain beneath the first and second mask patterns 210 and 230a.

According to the aforementioned embodiment, although an exposure apparatus having a great pitch size such as a distance between the first mask patterns 210 is provided with a light source having a wavelength relatively greater than an exposure apparatus capable of simultaneously forming the first and second mask patterns 210 and 230a, mask patterns having a smaller pitch size than the pitch size can be formed through the aforementioned exposure apparatus having a great pitch size. That is, the mask patterns can be formed to have a smaller pitch size than the limiting resolution of the photolithography process.

Figure 2H:
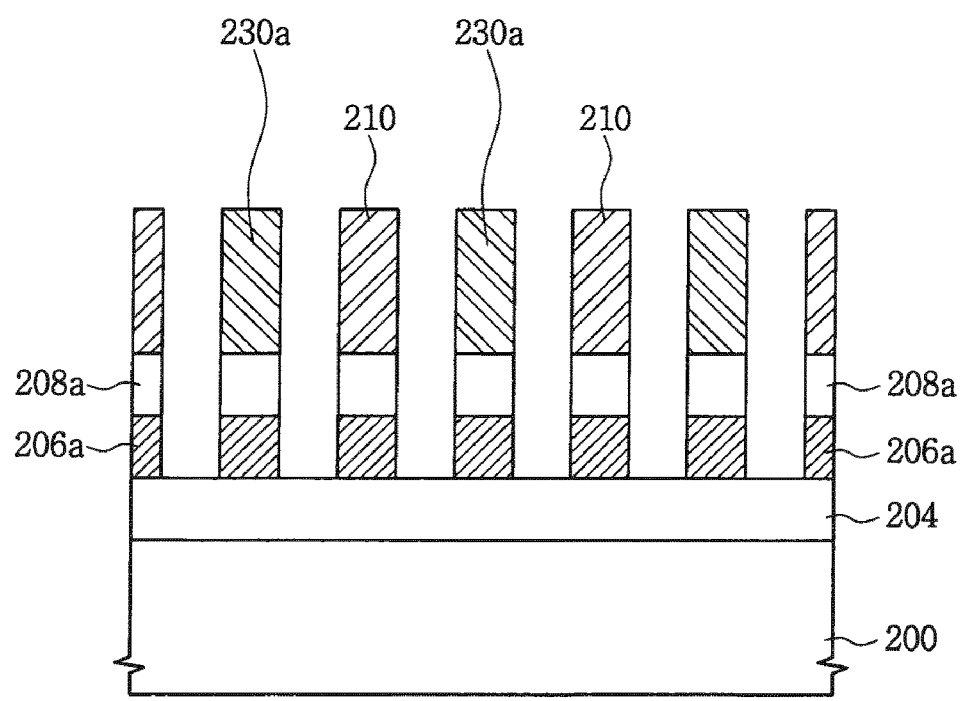

Referring to FIG. 2H, the second layer 206 is etched using the first and second mask patterns 210 and 230a and the buffer mask patterns 208a as an etching mask, thereby forming conductive patterns 206a. The etching of the second layer 206 can be performed using an anisotropic etching process, an isotropic etching process, or a process employing the both. In the current embodiment, when the first and second mask patterns 210 and 230a include poly-silicon layers, the first and second mask patterns 210 and 230a may be reduced. In this case, since the buffer mask pattern 208a has etching resistance, the buffer mask pattern 208a can serve as an etching mask while the second layer 206 is etched.

Meanwhile, in another embodiment, when employing the buffer mask layer 208 as an interlayer dielectric layer, the first and second mask patterns 210 and 230a may be formed to expose a predetermined region of the interlayer dielectric layer. The first and second mask patterns 210 and 230a may be formed using the method described with reference to the aforementioned embodiment.

As described above, according to the technology, second mask patterns are formed between sacrificial layers formed along outer walls of the first mask patterns, so that the first and second mask patterns can be formed to have a smaller pitch size than limiting resolution of a photolithography process. In addition, a crosslinking reaction of a reactive layer is performed with the first mask patterns around the first mask patterns, thereby forming the sacrificial layers. As a result, the sacrificial layers can be controlled to have a uniform width along the outer walls of the first mask patterns. Accordingly, the sacrificial layers can be formed to have uniform gaps between the first mask patterns.

What is claimed is:

1. A method of forming a fine pattern, comprising:
   providing a substrate;
   forming a first mask pattern comprising silicon nitride on the substrate;
   forming a reaction promoting layer comprising hexamethyldisilazane (HMDS) along outer surfaces of the first mask pattern and the substrate exposed between the first mask pattern on the substrate having the first mask pattern;
   forming a reactive layer comprising a silicon oxide polymer on the reaction promoting layer;
   reacting the reactive layer with the first mask pattern, employing a chemical attachment process, thereby forming sacrificial layers along outer walls of the first mask pattern;
   providing that a portion of the reactive layer is unreacted after completion of the chemical attachment process, removing the unreacted portion to expose the sacrificial layers;
   forming a second mask pattern between the sacrificial layers adjacent to the sidewalls of the first mask pattern which are facing each other;
   removing the sacrificial layers to expose the first and second mask pattern; and
   etching the substrate using the first and second mask pattern as an etching mask.

2. The method according to claim 1, wherein the chemical attachment process comprises a crosslinking reaction performed at a boundary region between the reactive layer and the first mask pattern, and a crosslinking reaction performed in the reactive layer adjacent to the boundary region.

3. The method according to claim 1, wherein the reactive layer comprises a material layer having an etch selectivity with respect to the first and second mask pattern.

4. The method according to claim 1, wherein the reactive layer contains the silicon oxide polymer having the following Chemical Formula 1:

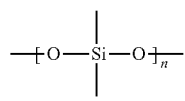

(1)

wherein n denotes a positive number from 1 to 5000.

5. The method according to claim 4, wherein forming of the reactive layer comprises forming the silicon oxide polymer on the substrate using a spin coating process.

6. The method according to claim 4, wherein the silicon oxide polymer further comprises at least one of alkoxy and methoxy groups.

7. The method according to claim 1, wherein the reactive layer that is unreacted is removed using a tetramethyl ammonium hydroxide (TMAH) solution.

8. The method according to claim 1, wherein the reactive layer further comprises a crosslinker.

9. The method according to claim 8, wherein the crosslinker comprises a material having the following Chemical Formula 2:

(2)

wherein R denotes an alkyl group, and n denotes a positive number of about 1 to 5000.

10. The method according to claim 1, wherein the reactive layer further comprises a surfactant.

11. The method according to claim 1, wherein the forming of the sacrificial layers comprises heating the reactive layer using a heating process, the heating process being performed through a rear surface of the substrate.

12. The method according to claim 11, wherein the heating process is performed at a temperature in a range from about 100° C. to 120° C. for about 60 to 90 seconds.

13. The method according to claim 1, wherein the sacrificial layers are formed to extend up to the substrate between the first mask pattern.

14. The method according to claim 1, before forming the first mask pattern, forming a buffer mask layer on the substrate.

15. The method according to claim 1, wherein providing of the substrate comprises:
   preparing a semiconductor substrate; and
   forming one layer selected from at least one of a conductive layer, an insulating layer, and a combination layer thereof, on the semiconductor substrate.

16. The method according to claim 1, wherein forming of the second mask pattern comprises:
   forming a mask layer on the substrate having the sacrificial layers; and
   planarizing the mask layer such that the mask layer remains between the sacrificial layers.

17. The method according to claim 1, wherein the first and second mask pattern are formed having top surfaces at the same level.

18. The method according to claim 1, wherein a distance between opposite sidewalls of the sacrificial layers between the neighboring first mask pattern is substantially the same as the width of the first mask pattern.

19. A method of forming a fine pattern, comprising:
   providing a substrate;
   forming a first mask pattern comprising silicon nitride or silicon on the substrate;
   forming a reaction promoting layer comprising hexamethyldisilazane (HMDS) directly on the first mask pattern;
   forming a reactive layer directly on the reaction promoting layer, wherein the reactive layer comprises a silicon oxide polymer having the following Chemical Formula 1:

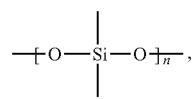  (1)

and
a crosslinker having the following Chemical Formula 2:

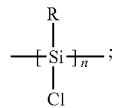  (2)

reacting the reactive layer with the first mask pattern, thereby forming a sacrificial layer directly on surfaces of the first mask pattern and remaining an unreacted portion of the reactive layer;
removing the unreacted portion to expose the sacrificial layer;
forming a second mask pattern on the sacrificial layer, wherein the second mask pattern comprises silicon nitride or silicon on the substrate and exposes an upper portion of the sacrificial layer; and
removing the exposed sacrificial layer.

20. The method according to claim 19, wherein the R of the Chemical Formula 2 is one of alkoxy and methoxy groups.

* * * * *